United States Patent
Niu et al.

(10) Patent No.: US 12,514,075 B2
(45) Date of Patent: Dec. 30, 2025

(54) DISPLAY PANEL HAVING FAN-OUT LINE LAYER LOCATED IN DIFFERENT LAYER FROM DRIVING CIRCUIT LAYER AT DISPLAY AREA, AND DISPLAY DEVICE

(71) Applicant: Wuhan China Star Optoelectronics Semiconductor Display Technology Co., Ltd., Hubei (CN)

(72) Inventors: Yanfen Niu, Hubei (CN); Ruifang Wang, Hubei (CN); Shize Li, Hubei (CN)

(73) Assignee: Wuhan China Star Optoelectronics Semiconductor Display Technology Co., Ltd., Wuhan (CN)

( * ) Notice: Subject to any disclaimer, the term of this patent is extended or adjusted under 35 U.S.C. 154(b) by 686 days.

(21) Appl. No.: 17/789,236

(22) PCT Filed: May 18, 2022

(86) PCT No.: PCT/CN2022/093563
§ 371 (c)(1),
(2) Date: Jun. 27, 2022

(87) PCT Pub. No.: WO2023/201816
PCT Pub. Date: Oct. 26, 2023

(65) Prior Publication Data
US 2024/0188354 A1  Jun. 6, 2024

(30) Foreign Application Priority Data

Apr. 19, 2022 (CN) .......................... 202210408196.2

(51) Int. Cl.
*H10K 59/131* (2023.01)
*H10K 102/00* (2023.01)

(52) U.S. Cl.
CPC ..... *H10K 59/131* (2023.02); *H10K 2102/311* (2023.02)

(58) Field of Classification Search
CPC ..... H10D 86/441; H10D 86/60; H10K 59/131
See application file for complete search history.

(56) References Cited

U.S. PATENT DOCUMENTS

| 2014/0117320 A1 | 5/2014 | Jung | |
| 2022/0310717 A1* | 9/2022 | Sun | H10K 59/123 |
| 2023/0043145 A1* | 2/2023 | Yuan | H10K 59/131 |

FOREIGN PATENT DOCUMENTS

| CN | 107870492 | 4/2018 |
| CN | 109118966 | 1/2019 |

(Continued)

OTHER PUBLICATIONS

International Search Report and the Written Opinion Dated Dec. 22, 2022 From the International Searching Authority Re. Application No. PCT/CN2022/093563 and Its Translation Into English. (20 Pages).

(Continued)

*Primary Examiner* — Nelson Garces (57) ABSTRACT

A display panel and a display device are provided. The display panel has a hole-drilling area and a display area which are disposed adjacent to each other and includes a driving array substrate and a light-emitting device layer which are sequentially located in the display area. The driving array substrate includes a substrate, a driving circuit layer, and a fan-out line layer. The driving circuit layer includes a plurality of first data lines and a plurality of second data lines, which are divided, by the hole-drilling area, into a first sub-data line and a second sub-data line. The fan-out line layer includes a plurality of fan-out lines and a plurality of data connecting lines, which are electrically (Continued)

connected to the first sub-data lines and the second sub-data lines.

20 Claims, 4 Drawing Sheets

(56) References Cited

FOREIGN PATENT DOCUMENTS

| | | |
|---|---|---|
| CN | 110286534 | 9/2019 |
| CN | 110634920 | 12/2019 |
| CN | 110931515 | 3/2020 |
| CN | 111653603 | 9/2020 |
| CN | 212725309 | 3/2021 |
| CN | 113410257 | 9/2021 |
| CN | 113410257 A  * | 9/2021 |
| CN | 113870713 | 12/2021 |
| CN | 114171574 | 3/2022 |
| CN | 114220834 | 3/2022 |

OTHER PUBLICATIONS

Notification of Office Action and Search Report Dated Jan. 27, 2025 From the State Intellectual Property Office of the People's Republic of China Re. Application No. 202210408196.2 and Its Translation into English. (21 Pages).

* cited by examiner

DISPLAY PANEL HAVING FAN-OUT LINE LAYER LOCATED IN DIFFERENT LAYER FROM DRIVING CIRCUIT LAYER AT DISPLAY AREA, AND DISPLAY DEVICE

RELATED APPLICATIONS

This application is a National Phase of PCT Patent Application No. PCT/CN2022/093563 having International filing date of May 18, 2022, which claims the benefit of priority of Chinese Patent Application No. 202210408196.2 filed on Apr. 19, 2022. The contents of the above applications are all incorporated by reference as if fully set forth herein in their entirety.

FIELD AND BACKGROUND OF THE INVENTION

The present disclosure relates to the display technology field, and more particularly to a display panel and a display device.

Active-matrix organic light emitting diode (AMOLED) display panels have gradually replaced liquid crystal displays (LCD) to be a new generation of display technology due to its high contrast ratio, wide color gamut, low power consumption, and other display advantages. Compared with conventional LCD panels, OLED display panels are easy to be flexible and are a key technology for wearable and foldable products.

With the development of OLED panel technology, OLED display is not limited to the development of wearable and foldable products. In order to achieve better display effect and bring better visual enjoyment for users, a narrow border technology has gradually become a highlight of attracting user groups. However, due to limitations of panel resolution, evaporation accuracy, and packaging, a frame of a panel is still relatively large.

SUMMARY OF THE INVENTION

The present disclosure provides a display panel and a display device. On the basis of disposing fan-out lines in a display area, data connecting lines are also disposed in the display area. This is beneficial for reducing a width of a periphery frame of the display area and reducing a width of a frame of a hole-drilling area, thereby realizing an extremely narrow frame.

In a first aspect, the present disclosure provides a display panel having a hole-drilling area and a display area which are disposed adjacent to each other; the display panel including a driving array substrate located in the display area and a light-emitting device layer located on the driving array substrate; and the driving array substrate including a substrate and a driving circuit layer and a fan-out line layer which are sequentially located on the substrate; and the driving circuit layer including a plurality of first data lines and a plurality of second data lines extending along a first direction; each of the second data lines divided, by the hole-drilling area, into a first sub-data line and a second sub-data line along the first direction; the fan-out line layer including a plurality of fan-out lines, which are electrically to the first data lines and the second data lines in a one-to-one correspondence, and a plurality of data connecting lines, which are correspondingly and electrically connected to the second data lines; and two ends of each of the data connecting lines respectively and electrically connected to a corresponding one of the first sub-data lines and a corresponding one of the second sub-data line.

In the display panel provided by the present disclosure, the data connecting lines and at least a portion of the fan-out lines are disposed in the same layer.

In the display panel provided by the present disclosure, the fan-out line layer includes a first line layer and a second line layer which are sequentially located on the driving circuit layer; and the fan-out lines are at least located in one of the line layer and the second line layer; and the data connecting lines are at least located in one of the first line layer and the second line layer.

In the display panel provided by the present disclosure, the driving circuit layer further includes a plurality of scan lines; and the scan lines extend along a second direction perpendicular to the first direction; and the scan lines are insulated from and intersected with the first data lines and the second data lines to form a plurality of pixel areas disposed in a plurality of rows and a plurality of columns;

each of the data connecting lines includes a first data line connecting portion extending along the first direction and a second data line connecting portion and a third data line connecting portion extending along the second direction; one end of the second data line connecting portion is electrically connected to a corresponding one of the first sub-data lines, and the other end is electrically connected to one end of the first data line connecting portion; the other end of the first data line connecting portion is electrically connected to one end of the third data line connecting portion; and the other end of the third data line connecting portion is electrically connected to a corresponding one of the second sub-data line; and the first data line connecting portion is disposed corresponding to multiple of the pixel areas along a column direction, and the second data line connecting portion and the third data line connecting portion are disposed corresponding to multiple of the pixel areas along two different row directions.

In the display panel provided by the present disclosure, each of the pixel areas includes at least one line change hole extending in a direction perpendicular to the display panel and used for connecting different metal layers; the first data line connecting portion includes a bending portion disposed corresponding to the line change hole in a corresponding one of the pixel areas; and the bending portion is bent in a direction away from the corresponding line change hole.

In the display panel provided by the present disclosure, a shape of the bending portion includes one of a rectangle, a triangle, and an arc.

In the display panel provided by the present disclosure, an orthographic projection of at least one of the first data lines on the substrate is located in an orthographic projection between two adjacent ones of the first data line connecting portions on the substrate.

In the display panel provided by the present disclosure, at least some of the first data line connecting portions are disposed to overlap middle positions of the corresponding multiple of the pixel areas.

In the display panel provided by the present disclosure, the display area is disposed around the hole-drilling area, and the hole-drilling area is symmetrical with respect to a symmetry axis extending along the first direction; and the data connecting lines are symmetrically disposed with respect to the symmetry axis.

In the display panel provided by the present disclosure, a material of the fan-out lines and the data connecting lines includes indium tin oxide.

In a second aspect, the present disclosure provides a display device including any one of the above-mentioned display panel and a driving integrated circuit; the display panel further includes a binding area located at one side of the display area; the driving integrated circuit is bound on and connected to the binding area; and the fan-out lines extend from the display area to the binding area and are electrically connected to the driving integrated circuit.

In the display device provided by the present disclosure, the data connecting lines and at least a portion of the fan-out lines are disposed in the same layer.

In the display device provided by the present disclosure, the fan-out line layer includes a first line layer and a second line layer which are sequentially located on the driving circuit layer; and the fan-out lines are at least located in one of the line layer and the second line layer; and the data connecting lines are at least located in one of the first line layer and the second line layer.

In the display device provided by the present disclosure, the driving circuit layer further includes a plurality of scan lines; and the scan lines extend along a second direction perpendicular to the first direction; and the scan lines are insulated from and intersected with the first data lines and the second data lines to form a plurality of pixel areas disposed in a plurality of rows and a plurality of columns;

each of the data connecting lines includes a first data line connecting portion extending along the first direction and a second data line connecting portion and a third data line connecting portion extending along the second direction; one end of the second data line connecting portion is electrically connected to a corresponding one of the first sub-data lines, and the other end is electrically connected to one end of the first data line connecting portion; the other end of the first data line connecting portion is electrically connected to one end of the third data line connecting portion; and the other end of the third data line connecting portion is electrically connected to a corresponding one of the second sub-data line; and the first data line connecting portion is disposed corresponding to multiple of the pixel areas along a column direction, and the second data line connecting portion and the third data line connecting portion are disposed corresponding to multiple of the pixel areas along two different row directions.

In the display device provided by the present disclosure, each of the pixel areas includes at least one line change hole extending in a direction perpendicular to the display panel and used for connecting different metal layers; the first data line connecting portion includes a bending portion disposed corresponding to the line change hole in a corresponding one of the pixel areas; and the bending portion is bent in a direction away from the corresponding line change hole.

In the display device provided by the present disclosure, a shape of the bending portion includes one of a rectangle, a triangle, and an arc.

In the display device provided by the present disclosure, an orthographic projection of at least one of the first data lines on the substrate is located in an orthographic projection between two adjacent ones of the first data line connecting portions on the substrate.

In the display device provided by the present disclosure, at least some of the first data line connecting portions are disposed to overlap middle positions of the corresponding multiple of the pixel areas.

In the display device provided by the present disclosure, the display area is disposed around the hole-drilling area, and the hole-drilling area is symmetrical with respect to a symmetry axis extending along the first direction; and the data connecting lines are symmetrically disposed with respect to the symmetry axis.

In the display device provided by the present disclosure, a material of the fan-out lines and the data connecting lines includes indium tin oxide.

In the display panel and the display device provided by the present embodiment compared with the prior art, the fan-out lines and the data connecting lines are disposed in the display area and are specifically disposed in the fan-out line layer located on the driving circuit layer, so that the fan-out lines and the data connecting lines are arranged in a different layer from the first data lines and the second data lines in the driving circuit layer 7. In one aspect, it can be avoided that the fan-out lines are disposed in the non-display area, so as to reduce the width of the periphery frame of the display area. In another aspect, it can be avoided that the data connecting lines are disposed in the edge of the hole-drilling area. This is beneficial for reducing the width of the frame of the hole-drilling area. In yet another aspect, it can be avoided that the fan-out lines and the data connecting lines are disposed in the driving circuit layer, so as to avoid unstable signal transmission because of dense lines in the driving circuit layer. Accordingly, the present disclosure realizes an extremely narrow frame of the display device on the basis of ensuring stable display effect.

DESCRIPTION OF SPECIFIC EMBODIMENTS OF THE INVENTION

Hereinafter, exemplary embodiments of the present disclosure will be described with reference to the accompanying drawings. The same or similar elements or the elements with the same or similar functions will be designated by the same or similar reference numerals throughout the following description and drawings. The following embodiments described with the accompanying drawings are merely exemplary to explain the present disclosure and not to be construed as limiting the present disclosure.

In the description of the present disclosure, it should be understood that orientations or position relationships indicated by the terms "center", "longitudinal", "lateral", "length", "width", "thickness", "upper", "lower", "front", "rear", "left", "right", "vertical", "horizontal", "top". "bottom", "inside", "outside", "clockwise", and "counter-clockwise" are based on orientations or position relationships illustrated in the drawings. The terms are used to facilitate and simplify the description of the present disclosure, rather than indicate or imply that the devices or elements referred to herein is required to have specific orientations or be constructed or operates in the specific orientations. Accordingly, the terms should not be construed as limiting the present disclosure. Furthermore, the terms "first" and "second" are for descriptive purposes only and should not be construed as indicating or implying relative importance or implying the number of technical features. As such, the features defined by the term "first" and "second" may include one or more of the features explicitly or implicitly. In the description of the present disclosure, the term "more" refers two or more than two, unless otherwise specifically defined.

In the description of the present disclosure, it should be noted that unless otherwise clearly defined and limited, the terms "mounted", "connected/coupled", and "connection" should be interoperated broadly. For example, the terms may refer to a fixed connection, a detachable connection, or an integral connection; the terms may also refer to a mechanical connection, an electrical connection, or communication with each other; the terms may further refer to a direct connection, an indirect connection through an intermediary, or an interconnection between two elements or interactive relationship between two elements. Those skilled in the art can understand the specific meanings of the above-mentioned terms in the present disclosure according to circumstances.

In the present disclosure, it should be noted that unless otherwise clearly defined and limited, a first feature "on" or "under" a second feature may mean that the first feature directly contacts the second feature, or that the first feature contacts the second feature via an additional feature there between instead of directly contacting the second feature. Moreover, the first feature "on", "above", and "over" the second feature may mean that the first feature is right over or obliquely upward over the second feature or mean that the first feature has a horizontal height higher than that of the second feature. The first feature "under". "below", and "beneath" the second feature may mean that the first feature is right beneath or obliquely downward beneath the second feature or mean that that horizontal height of the first feature is lower than that of the second feature.

The following description provides various embodiments or examples for implementing various structures of the present disclosure. To simplify the description of the present disclosure, parts and settings of specific examples are described as follows. Certainly, they are only illustrative, and are not intended to limit the present disclosure. Further, reference numerals and reference letters may be repeated in different examples. This repetition is for purposes of simplicity and clarity and does not indicate a relationship of the various embodiments and/or the settings. Furthermore, the present disclosure provides specific examples of various processes and materials, however, applications of other processes and/or other materials may be appreciated those skilled in the art.

Figure 1:
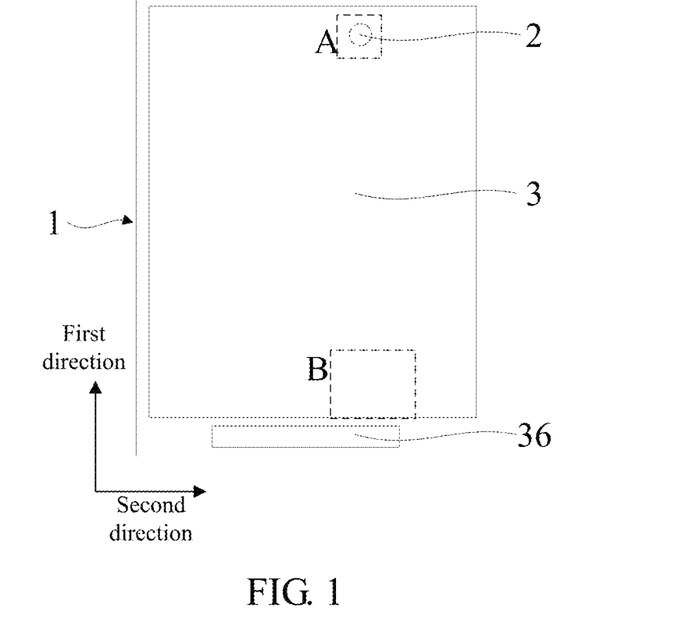
FIG. 1 illustrates a top view of a display panel provided by an embodiment of the present disclosure.
Figure 2:
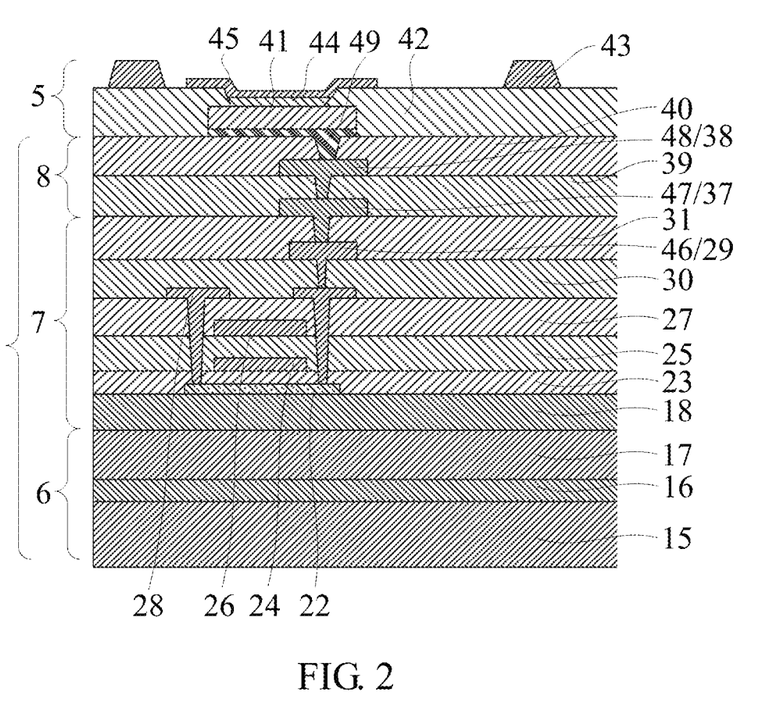
FIG. 2 illustrates a schematic diagram of a partial cross-sectional structure of a pixel area of the display panel provided by an embodiment of the present disclosure.
Figure 3:
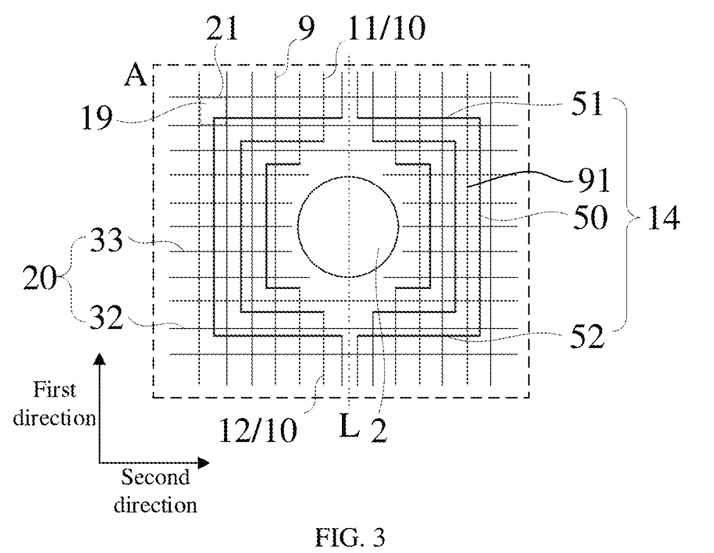
FIG. 3 illustrates a partial enlarged view of a part A in FIG. 1.
Figure 4:
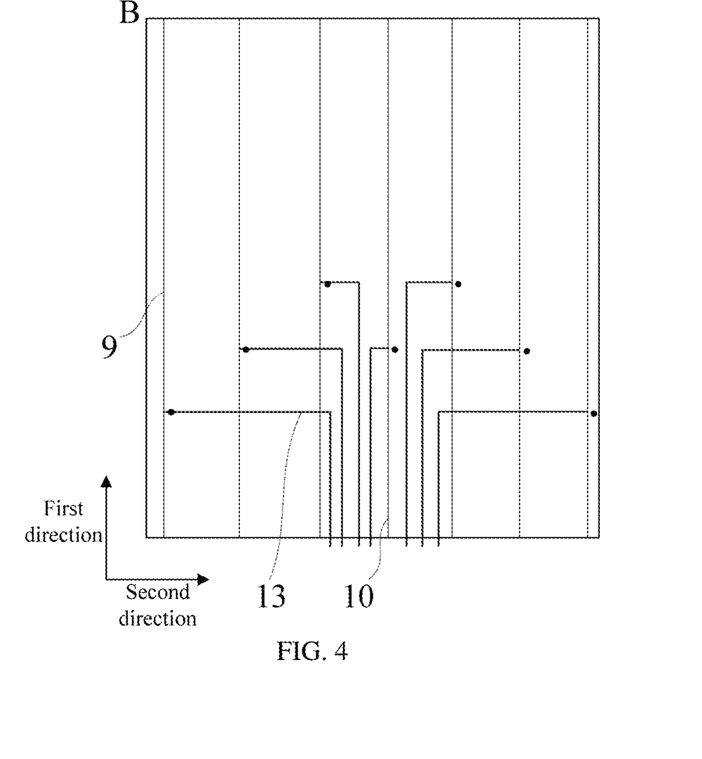
FIG. 4 illustrates a partial enlarged view of a part B in FIG. 1.

As shown in FIG. 1 to FIG. 4, an embodiment of the present disclosure provides a display panel 1. The display panel 1 has a hole-drilling area 2 and a display area 3 disposed adjacent to the hole-drilling area 2. As shown in FIG. 2, the display panel 1 includes a driving array substrate 4 located in the display area 3 and a light-emitting device layer 5 located on the driving array substrate 4. The driving array substrate 4 includes a substrate 6 and a driving circuit layer 7 and a fan-out line layer 8 which are sequentially located on the substrate 6. The driving circuit layer 7 includes a plurality of first data lines 9 and a plurality of second data lines 10 extending along a first direction (for example, a vertical direction, i.e., a column direction hereinafter). Each of the second data lines 10 is divided, by the hole-drilling area 2, into a first sub-data line 11 and a second sub-data line 12 along the first direction. As shown in FIG. 3 and FIG. 4, the fan-out line layer 8 includes a plurality of fan-out lines 13, which are electrically to the first data lines 9 and the second data lines 10 in a one-to-one correspondence, and a plurality of data connecting lines 14, which are correspondingly and electrically connected to the second data lines 10. Two ends of each of the data connecting lines 14 are respectively and electrically connected to a corresponding one of the first sub-data lines 11 and a corresponding one of the second sub-data line 12.

It can be understood that in the embodiment of the present disclosure, the data connecting lines 14 for connect the first sub-data lines 11 and the second sub-data lines 12 are wound around the display area 3, so as to avoid that the data connecting lines 14 are disposed in an edge of the hole-drilling area 2. This can effectively reduce a width of a frame width of the hole-drilling area 2. Moreover, in the embodiment of the present disclosure, the fan-out lines 13 for transmitting data signals to the first data lines 9 and the second data lines 10 are disposed in the display area. 3, so as to avoid that the fan-out lines 13 are disposed in a non-display area. This can effectively reduce a width of a peripheral frame (non-display area) of the display area 3. That is, a width of a peripheral frame of the display panel 1 can be reduced.

Specifically, the display panel 1 includes a through hole located in the hole-drilling area 2, penetrating at least the driving array substrate 4 and the light-emitting device layer 5 of the display panel 1 in a direction perpendicular to the display panel 1, and used for disposing an under-screen camera or any other optical device. The display area 3 can be arranged around the whole of the hole-drilling area 2 or can be arranged along a part of the edge of the hole-drilling area 2. The present disclosure is not limited herein. For the convenience of description, the embodiment of the present disclosure is described by taking the display area 3 surrounding the hole-drilling area 2 as an example for description.

Specifically, the substrate 6 of the driving array substrate 4 can be a flexible substrate. In a specific embodiment, as shown in FIG. 2, the substrate 6 includes a first flexible layer 15 and a first buffer layer 16 and a second flexible layer 17 which are sequentially disposed on the first flexible layer 15. A material of the first flexible layer 15 and the second flexible layer 17 is an organic material, such as polyimide (PI). A material of the first buffer layer 16 is an inorganic material, such as at least one of silicon oxide and silicon nitride.

In a specific embodiment, as shown in FIG. 2, one side of the driving circuit layer 7 close to the substrate 6 is further provided with a second buffer layer 18. Certainly, in other embodiments, the one side of the driving circuit layer 7 close to the substrate 6 is further provided with a barrier layer. Sequential positions of the second buffer layer 18 and the barrier layer are not limited.

Specifically, the driving circuit layer 7 of the driving array substrate 4 includes a plurality of pixel driving circuit units 19 distributed in an array, a plurality of data lines (e.g., the first data lines 9 and the second data lines 10) electrically connected to the pixel driving circuit units 19, and a plurality of scan lines 20. Certainly, the driving circuit layer 7 further includes a power signal line (e.g., a VDD signal line) disposed in parallel with the data lines and other signal lines (e.g., an EM signal line) disposed in parallel with the scan lines 20.

Specifically, the scan lines 20 extend along a second direction perpendicular to the first direction (for example, a horizontal direction, i.e., a row direction hereinafter). The scan lines 20 are insulated from and intersected with the first data lines 9 and the second data lines 10 to form a plurality of pixel areas 21 disposed in a plurality of rows and a plurality of columns. Each of the pixel areas 21 corresponds to one of the pixel driving circuit unit 19.

Specifically, each of the pixel driving circuit units 19 includes at least one thin film transistor. In a specific embodiment, each of the pixel driving circuit units 19 includes a 7T1C pixel driving circuit. Certainly, the present disclosure is not limited thereto.

In a specific embodiment, a driving thin film transistor of each of the pixel driving circuit units 19 includes an active layer 22 (e.g., polysilicon), a first gate insulating layer 23, a first gate layer 24, a second gate insulating layer 25, an interlayer insulating layer 27, and a source/drain electrode layer. A source electrode and a drain electrode of the source/drain electrode layer are respectively and electrically to two ends of the active layer 22 via through holes penetrating the first gate insulating layer 23, the second gate insulating layer 25, and the interlayer insulating layer 27. The first gate electrode, the second gate electrode, and the active layer 22 are disposed correspondingly. Specifically, the source/drain electrode layer can be a double-layer electrode structure. For example, the source/drain electrode layer includes a first source/drain electrode layer 28 and a second source/drain electrode layer 29 which are sequentially located on the interlayer insulating layer 27. One side of each of the pixel driving circuit units 19 away from the substrate 6 is further provided with a first flat layer 30 located between the first source/drain electrode layer 28 and the second source/drain electrode layer 29, and with a second flat layer 31 located on one side of the second source/drain electrode layer 29 away from the first source/drain electrode layer 28.

It can be understood that the scan lines 20 and the gate layer (the first gate layer 24 or the second gate layer 26) are disposed in the same layer, and the first data lines 9, the second data lines 10, and the source/drain electrode layer (the first source/drain electrode layer 28 or the second source/drain electrode layer 29) are disposed in the same layer. It should be noted that in the present disclosure, a number and types of thin film transistors in each of the pixel driving circuit units 19 are not limited, and a structure of the driving thin film transistor described above is only exemplary description.

Specifically, the light-emitting device layer 5 includes a plurality of organic light-emitting devices (e.g., OLED devices) electrically connected to the pixel driving circuit units 19 in a one-to-one correspondence. In a specific embodiment, the organic light-emitting devices and the pixel areas 21 are disposed in a one-to-one correspondence.

Specifically, the first data lines 9 and the hole-drilling area 2 are not crossed with each other. That is, the first data lines 9 are not affected by the hole-drilling area 2 and normally and continuously extend along the first direction. Each of the second data lines 10 is disposed corresponding to the hole-drilling area 2 and divided into two parts by the hole-drilling 2 in the first direction, that is, the first sub-data line 11 and the second sub-data line 12. It can be understood that the data signals of the first sub-data line 11 and the second sub-data line 12 are the same.

In a specific embodiment, as shown in FIG. 3, each of the first data lines 9 is correspondingly and electrically connected to a column of pixel driving circuit units 19 (or pixel regions 21), and each of the second data lines 10 is correspondingly and electrically connected to a column of pixel driving circuit units 19. The first data lines 9 and the second data lines 10 respectively provide the data signals to the corresponding pixel driving circuit units 19.

Specifically, as shown in FIG. 3, the scan lines 20 include a plurality of first scan lines 32 and a plurality of second scan lines 33. Each of the second scan lines 33 is divided into two parts by the hole-drilling area 2, for example, a first sub-scan line and a second sub-scan line located at two sides of the hole-drilling region 2 along the second direction. In a specific embodiment, the display panel 1 includes GOA circuits located at two sides of the display area 3 in the second direction and respectively providing scan signals to the scan lines 20 from two sides. Specifically, the first-sub scan line and the second sub-scan line are respectively connected to the two GOA circuits, and the two GOA circuits respectively provide the scan signals to the first sub-scan line and the second sub-scan line from the two sides, so as to avoid to dispose scan connecting lines for connecting the first sub scan line and the second sub scan line in the display area 3. In another embodiment, the display panel 1 further includes scan connecting lines located in the display area 3 and located in the fan-out line layer 8 for connecting the first sub-scan lines and the second sub-scan lines. Even if there is only one GOA circuit, the scan signals can also be normally provided for the first sub-scan lines and the second sub-scan line. In the embodiment of the present disclosure, the scan connecting lines are not described in detail. A specific arrangement can refer to an arrangement of the data connecting lines 14.

Specifically, as shown in FIG. 1, the display panel 1 further includes a binding area 36 located at one or more sides of the display area 3 for disposing a driving integrated circuit (IC). One end of each of the fan-out lines 13 in the fan-out line layer 8 extends to the bonding area 36 to be electrically connected to the driving integrated circuit, and the other end is electrically connected to a corresponding one of the data lines and the scan lines in the display area 3. In the embodiment of the present disclosure, an electrical connection between one of the fan-out lines and one of the data lines is taken as an example for description, but the present disclosure is not limited thereto.

It can be understood that, the hole-drilling area 2 is usually disposed in an upper half of the display panel 1, and the binding area 36 is disposed in a lower border of the display panel 1. Accordingly, line areas of the data connecting lines 14 and the fan-out lines 13 do not overlap. This is beneficial for reducing a line density and increasing line spacing, thereby improving stability of the signals.

Specifically, the data connecting lines 14 and at least a portion of the fan-out lines 13 are disposed in the same layer.

Specifically, the fan-out line layer 8 includes at least one line layer. When multiple of the fan-out lines 13 are located in the same line layer, the data connecting lines 14 and the fan-out lines 13 are disposed in the same layer. When multiple of the fan-out lines 13 are distributed in multiple line layers, the data connecting lines 14 can be disposed only in one of the multiple line layers where the fan-out lines 13 are disposed or can be distributed in the multiple line layers where the fan-out lines 13 are disposed.

In a specific embodiment, as shown in FIG. 2, the fan-out line layer 8 includes a first line layer 37 and a second line layer 38 which are sequentially located on the driving circuit layer 7. The fan-out lines 13 are at least located in one of the line layer 37 and the second line layer 38, and the data connecting lines 14 are at least located in one of the first line layer 37 and the second line layer 38. For example, some of the fan-out lines 13 are located in the first line layer 37, and the others are located in the second line layer 38, so as to avoid that the lines are dense because multiple of the fan-out lines 13 is distributed in the same layer. Alternatively, each of the fan-out lines 13 includes two line portions which are electrically connected to each other. One of the two line portions is located in the first line layer 37, and the other is located in the second line layer 38. This can also avoid that the lines are dense.

In a specific embodiment, the data connecting lines 14 are located in the first line layer 37.

In another specific embodiment, the data connecting line 14 is located in the second line layer 38.

In yet another specific embodiment, some of the data connecting lines 14 are located in the first line layer 37, and the others are located in the second line layer 38.

In yet another specific embodiment, a portion of connecting lines of each of the data connecting lines 14 are located in the first line layer 37, and the other portion of the connecting lines are located in the second line layer 38. The two portions of the connecting lines are connected by via holes.

Specifically, as shown in FIG. 2, a third flat layer 39 is provided between the first line layer 37 and the second line layer 38, and a fourth flat layer 40 is provided on one side of the second line layer 38 away from the first line layer 37. The light-emitting device layer 5 includes an anode layer 41, a pixel definition layer 42, a support layer 43, a light-emitting layer 44, and a cathode layer 45 which are sequentially located on the fourth flat layer 40. The anode layer 41, the light-emitting layer 44, and the cathode layer 45 constitute an organic light-emitting device.

In a specific embodiment, as shown in FIG. 2, an electrically connection between the anode layer 41 and the source/drain electrode layer is implemented by a the first connecting electrode 46 located in the second source/drain electrode layer 29 and penetrating the first flat layer 30, a second connecting electrode 47 located in the first line layer 37 and penetrating the second flat layer 31, a third connecting electrode 48 located on the second line layer 38 and penetrating the third flat layer 39, and a fourth connecting electrode 49 located in the fourth flat layer 40 and penetrating the fourth flat layer 40. A material of each of the first connecting electrode 46, the second connecting electrode 47, and the third connecting electrode 48 includes, but is not limited to, indium tin oxide (ITO). A material of the fourth connecting electrode 49 includes, but is not limited to, indium zinc oxide (IZO).

Specifically, as shown in FIG. 3, each of the data connecting lines 14 includes a first data line connecting portion 50 extending along the first direction and a second data line connecting portion 51 and a third data line connecting portion 52 extending along the second direction. One end of the second data line connecting portion 51 is electrically connected to a corresponding one of the first sub-data lines 11, and the other end is electrically connected to one end of the first data line connecting portion 50, the other end of the first data line connecting portion 50 is electrically connected to one end of the third data line connecting portion 52, and the other end of the third data line connecting portion 52 is electrically connected to a corresponding one of the second sub-data line 12. The first data line connecting portion 50 is disposed corresponding to multiple of the pixel areas 21 along a column direction. The second data line connecting portion 51 and the third data line connecting portion 52 are disposed corresponding to multiple of the pixel areas 21 along two different row directions. Continuing to refer to FIG. 3, the first data line includes a data line segment 91. The data line segment 91 is a part between an intersection of the first data line 9 and the second data line connecting portion 51 and an intersection of the first data line 9 and the third data line connecting portion 52. Further, an orthographic projection of the first data line connecting portion 50 on the substrate 6 is not overlapped with an orthographic projection of the data line segment 91 on the substrate 6.

It can be understood that the first data line connecting portion 50, the second data line connecting portion 51, and the third data line connecting portion 52 can be located in the same line layer, for example, in the first line layer 37 or the second line layer 38. Certainly, they can also be located in different line layers. For example, the first data line connecting portion 50 is located in the second line layer 38, and the second data line connecting portion 51 and the third data line connecting portion 52 are located in the first line layer. 37.

Figure 5:
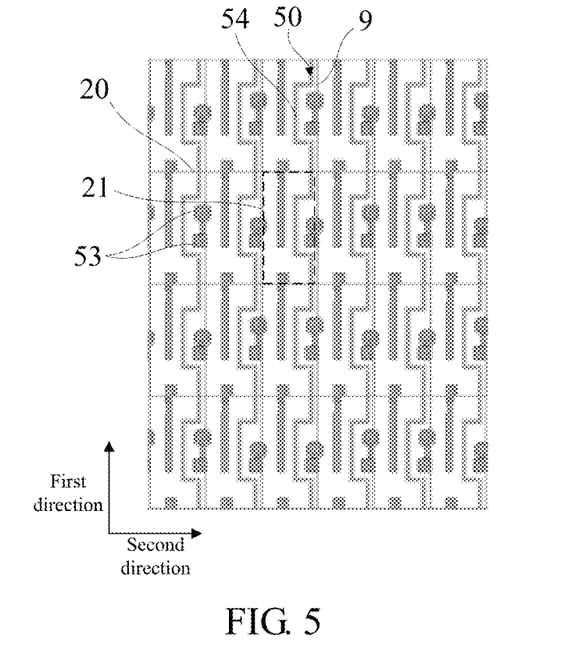
FIG. 5 illustrates a top view of a partial structure of a display area of the display panel provided by an embodiment of the present disclosure.
Figure 6:
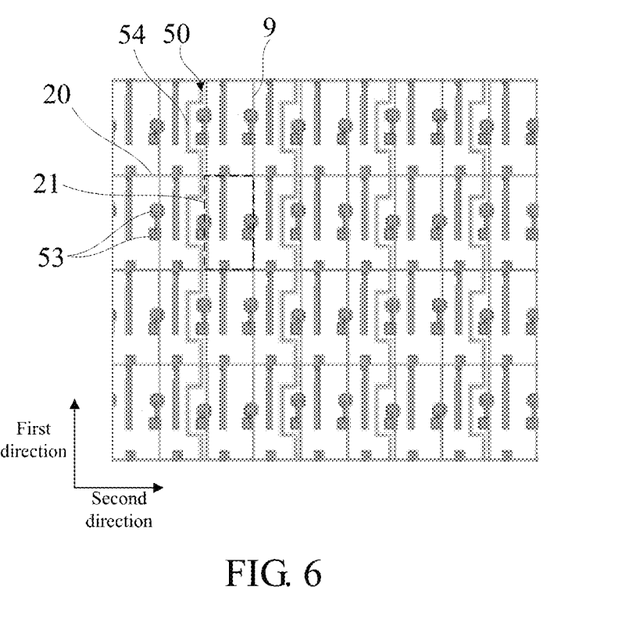
FIG. 6 illustrates a top view of a partial structure of a display area of another display panel provided by an embodiment of the present disclosure.

Specifically, as shown in FIG. 5 and FIG. 6, each of the pixel areas 21 includes at least one line change hole 53 extending in the direction perpendicular to the display panel 1 and used for connecting different metal layers. The first data line connecting portion 50 includes a bending portion 54 disposed corresponding to the line change hole 53 in a corresponding one of the pixel areas 21. The bending portion 54 is bent in a direction away from the corresponding line change hole 53 to avoid the line change hole 53. It can be understood that the line change hole 53 is filled with a conductive material (e.g., ITO), which is used for connecting lines or electrodes in upper and lower layers.

Figure 7:
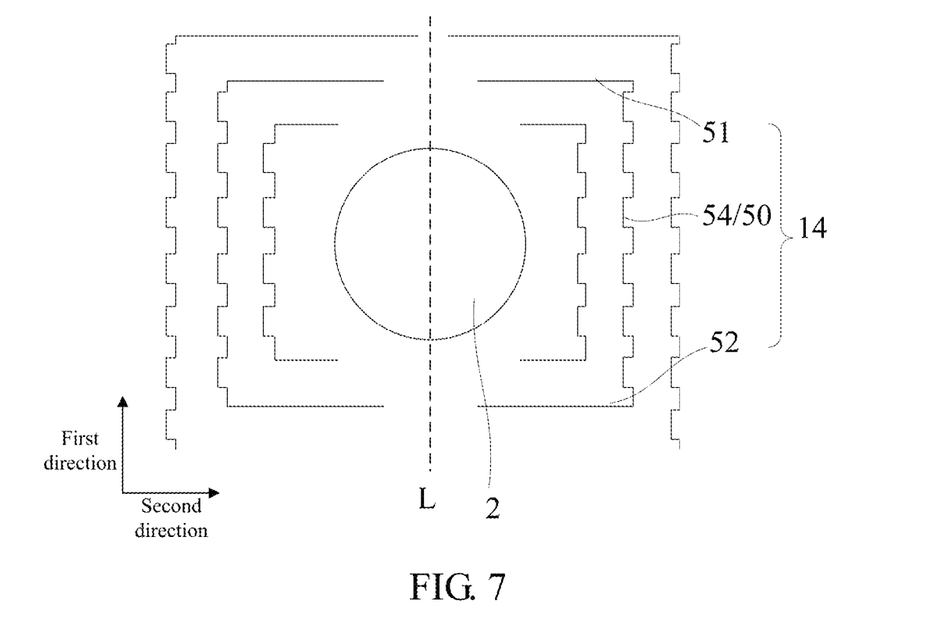
FIG. 7 illustrates a top view of a data connecting line provided by an embodiment of the present disclosure.
Figure 8:
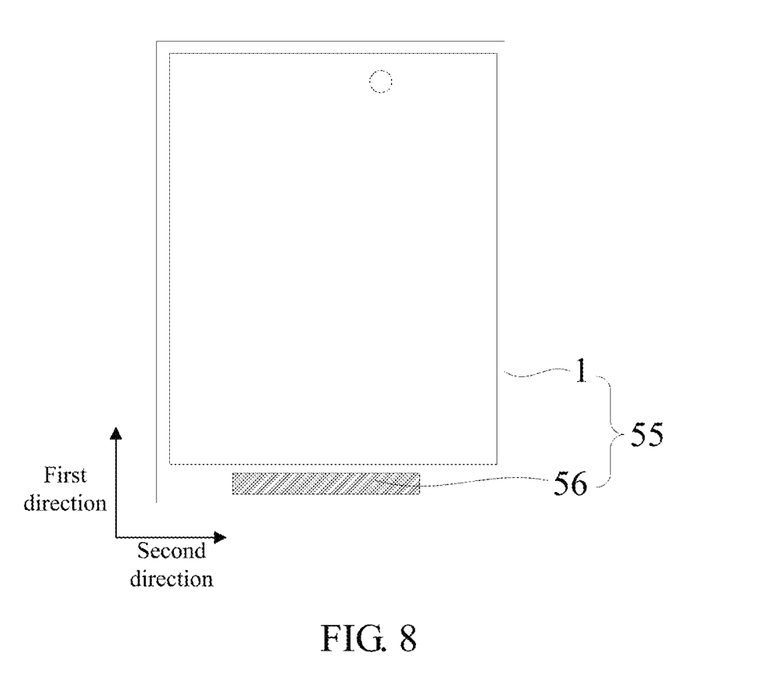
FIG. 8 illustrates a top view of a display device provided by an embodiment of the present disclosure.

It can be understood that as shown in FIG. 7, the first data line connecting portion 50 extends in a bent shape in the first direction. Specifically, a shape of the bending portion 54 includes one of a rectangle, a triangle, and an arc. In the present disclosure, only the rectangular bending portion 54 is taken as an example for description, and a specific shape is not limited to the shapes listed above.

Specifically, as shown in FIG. 5 and FIG. 6, an orthographic projection of at least one of the first data lines 9 on the substrate 6 is located in an orthographic projection between two adjacent ones of the first data line connecting portions 50 on the substrate 6. It can be understood that the first data line connecting portions 50 can be disposed corresponding to multiple adjacent columns of pixel areas 21, or one of the first data line connecting portions 50 can be disposed corresponding to at least two columns of pixel areas 21.

In a specific embodiment, at least some of the first data line connecting portions 50 are disposed to overlap middle positions of the corresponding multiple of the pixel areas 21 to achieve best shading effect.

In a specific embodiment, as shown in FIG. 3, the display area 3 is disposed around the hole-drilling area 2, and the hole-drilling area 2 is symmetrical with respect to a symmetry axis L extending along the first direction. The data connecting lines 14 are symmetrically disposed with respect to the symmetry axis L. Specifically, the second data lines 10 are also symmetrically disposed with respect to the symmetry axis L.

Specifically, a material of the fan-out lines 13 and the data connecting lines 14 includes, but is not limited to, ITO.

In the embodiment of the present disclosure, the fan-out lines 13 and the data connecting lines 14 are disposed in the display area 3 and are specifically disposed in the fan-out line layer 8 located on the driving circuit layer 7, so that the fan-out lines 13 and the data connecting lines 14 are arranged in a different layer from the first data lines 9 and the second data lines 10 in the driving circuit layer 7. In one aspect, it can be avoided that the fan-out lines 13 are disposed in the non-display area, so as to reduce the width of the periphery frame of the display area 3. In another aspect, it can be avoided that the data connecting lines 14 are disposed in the edge of the hole-drilling area 2. This is beneficial for reducing the width of the frame of the hole-drilling area 2. In yet another aspect, it can be avoided that the fan-out lines 13 and the data connecting lines are disposed in the driving circuit layer 7, so as to avoid unstable signal transmission because of dense lines in the driving circuit layer 7. Accordingly, the present disclosure realizes an extremely narrow frame of the display panel 1 on the basis of ensuring stable display effect.

Please refer to FIG. 1 to FIG. 8. An embodiment of the present disclosure further provides a display device 55. The display device 55 includes the above-mentioned display panel 1 and a driving integrated circuit 56. The display panel 1 further includes a binding area 36 located at one side of the display area 3. The driving integrated circuit 56 is bound on and connected to the binding area 36. The fan-out lines 13 extend from the display area 3 to the binding area 36 and are electrically connected to the driving integrated circuit 56. The driving integrated circuit 56 provides signals to the data lines and the scan lines 20 in the display area 3 via the fan-out lines 13.

In the embodiment of the present disclosure, the fan-out lines 13 and the data connecting lines 14 are disposed in the display area 3 and are specifically disposed in the fan-out line layer 8 located on the driving circuit layer 7, so that the fan-out lines 13 and the data connecting lines 14 are arranged in a different layer from the first data lines 9 and the second data lines 10 in the driving circuit layer 7. In one aspect, it can be avoided that the fan-out lines 13 are disposed in the non-display area, so as to reduce the width of the periphery frame of the display area 3. In another aspect, it can be avoided that the data connecting lines 14 are disposed in the edge of the hole-drilling area 2. This is beneficial for reducing the width of the frame of the hole-drilling area 2. In yet another aspect, it can be avoided that the fan-out lines 13 and the data connecting lines are disposed in the driving circuit layer 7, so as to avoid unstable signal transmission because of dense lines in the driving circuit layer 7. Accordingly, the present disclosure realizes an extremely narrow frame of the display device 55 on the basis of ensuring stable display effect.

The descriptions of the above-mentioned embodiments have different emphasis, and as for parts that are not described in detail in one embodiment, reference can be made to the relevant descriptions of other embodiments.

A display panel and a display device provided by the embodiments of the present disclosure are introduced in detail above. The principles and implementations of the present disclosure are illustrated through some embodiments. However, the descriptions of the above-mentioned embodiments are only used to help understand the technical solutions and core ideas of the present disclosure. Those skilled in the art should understand that they can still make modifications to the technical solutions described in the above-mentioned embodiments or make equivalent replacements to some technical features thereof, as long as such modifications or replacements do not cause the essence of corresponding technical solutions to depart from the spirit and scope of the technical solutions of the embodiments of the present disclosure.

What is claimed is:

1. A display panel, having a hole-drilling area and a display area which are disposed adjacent to each other; the display panel comprising a driving array substrate located in the display area and a light-emitting device layer located on the driving array substrate; and the driving array substrate comprising a substrate and a driving circuit layer and a fan-out line layer which are sequentially located on the substrate; and the driving circuit layer comprising a plurality of first data lines and a plurality of second data lines extending along a first direction; each of the second data lines divided, by the hole-drilling area, into a first sub-data line and a second sub-data line along the first direction; the fan-out line layer comprising a plurality of fan-out lines, which are electrically connected to the first data lines and the second data lines in a one-to-one correspondence, and a plurality of data connecting lines, which are correspondingly and electrically connected to the second data lines; and two ends of each of the data connecting lines respectively and electrically connected to a corresponding one of the first sub-data lines and a corresponding one of the second sub-data line;

wherein each of the data connecting lines comprises a first data line connecting portion extending along the first direction and a second data line connecting portion and a third data line connecting portion extending along a second direction perpendicular to the first direction; one end of the second data line connecting portion is electrically connected to a corresponding one of the first sub-data lines, and the other end is electrically connected to one end of the first data line connecting portion; the other end of the first data line connecting portion is electrically connected to one end of the third data line connecting portion; and the other end of the third data line connecting portion is electrically connected to a corresponding one of the second sub-data line;

wherein each of the first data lines comprises a data line segment between an intersection of the first data line and the second data line connecting portion and an intersection of the first data line and the third data line connecting portion, and an orthographic projection of the first data line connecting portion on the substrate is not overlapped with an orthographic projection of the data line segment on the substrate.

2. The display panel of claim 1, wherein the data connecting lines and at least a portion of the fan-out lines are disposed in the same layer.

3. The display panel of claim 2, wherein the fan-out line layer comprises a first line layer and a second line layer which are sequentially located on the driving circuit layer; and the fan-out lines are at least located in one of the line layer and the second line layer; and the data connecting lines are at least located in one of the first line layer and the second line layer.

4. The display panel of claim 1, wherein the driving circuit layer further comprises a plurality of scan lines; and the scan lines extend along the second direction; and the scan lines are insulated from and intersected with the first data lines and the second data lines to form a plurality of pixel areas disposed in a plurality of rows and a plurality of columns; and the first data line connecting portion is disposed corresponding to multiple of the pixel areas along a column direction, and the second data line connecting portion and the third data line connecting portion are disposed corresponding to multiple of the pixel areas along two different row directions.

5. The display panel of claim 4, wherein each of the pixel areas comprises at least one line change hole extending in a direction perpendicular to the display panel and used for connecting different metal layers; the first data line connecting portion comprises a bending portion disposed corresponding to the line change hole in a corresponding one of the pixel areas; and the bending portion is bent in a direction away from the corresponding line change hole.

6. The display panel of claim 5, wherein a shape of the bending portion comprises one of a rectangle, a triangle, and an arc.

7. The display panel of claim 4, wherein an orthographic projection of at least one of the first data lines on the substrate is located in an orthographic projection between two adjacent ones of the first data line connecting portions on the substrate.

8. The display panel of claim 4, wherein at least some of the first data line connecting portions are disposed to overlap middle positions of the corresponding multiple of the pixel areas.

9. The display panel of claim 1, wherein the display area is disposed around the hole-drilling area, and the hole-drilling area is symmetrical with respect to a symmetry axis extending along the first direction; and the data connecting lines are symmetrically disposed with respect to the symmetry axis.

10. The display panel of claim 1, wherein a material of the fan-out lines and the data connecting lines comprises indium tin oxide.

11. A display device, comprising a display panel and a driving integrated circuit; the display panel having a hole-drilling area and a display area which are disposed adjacent to each other; the display panel comprising a driving array substrate located in the display area and a light-emitting device layer located on the driving array substrate; and the driving array substrate comprising a substrate and a driving circuit layer and a fan-out line layer which are sequentially located on the substrate; and the driving circuit layer comprising a plurality of first data lines and a plurality of second data lines extending along a first direction; each of the second data lines divided, by the hole-drilling area, into a first sub-data line and a second sub-data line along the first direction; the fan-out line layer comprising a plurality of fan-out lines, which are electrically connected to the first data lines and the second data lines in a one-to-one correspondence, and a plurality of data connecting lines, which are correspondingly and electrically connected to the second data lines; and two ends of each of the data connecting lines respectively and electrically connected to a corresponding one of the first sub-data lines and a corresponding one of the second sub-data line;

wherein each of the data connecting lines comprises a first data line connecting portion extending along the first direction and a second data line connecting portion and a third data line connecting portion extending along a second direction perpendicular to the first direction; one end of the second data line connecting portion is electrically connected to a corresponding one of the first sub-data lines, and the other end is electrically connected to one end of the first data line connecting portion; the other end of the first data line connecting portion is electrically connected to one end of the third data line connecting portion; and the other end of the third data line connecting portion is electrically connected to a corresponding one of the second sub-data line;

wherein each of the first data lines comprises a data line segment between an intersection of the first data line and the second data line connecting portion and an intersection of the first data line and the third data line connecting portion, and an orthographic projection of the first data line connecting portion on the substrate is not overlapped with an orthographic projection of the data line segment on the substrate;

wherein the display panel further comprises a binding area located at one side of the display area; the driving integrated circuit is bound on and connected to the binding area; and the fan-out lines extend from the display area to the binding area and are electrically connected to the driving integrated circuit.

12. The display device of claim 11, wherein the data connecting lines and at least a portion of the fan-out lines are disposed in the same layer.

13. The display device of claim 12, wherein the fan-out line layer comprises a first line layer and a second line layer which are sequentially located on the driving circuit layer; and the fan-out lines are at least located in one of the line layer and the second line layer; and the data connecting lines are at least located in one of the first line layer and the second line layer.

14. The display device of claim 11, wherein the driving circuit layer further comprises a plurality of scan lines; and the scan lines extend along the second direction; and the scan lines are insulated from and intersected with the first data lines and the second data lines to form a plurality of pixel areas disposed in a plurality of rows and a plurality of columns; and the first data line connecting portion is disposed corresponding to multiple of the pixel areas along a column direction, and the second data line connecting portion and the third data line connecting portion are disposed corresponding to multiple of the pixel areas along two different row directions.

15. The display device of claim 14, wherein each of the pixel areas comprises at least one line change hole extending in a direction perpendicular to the display panel and used for connecting different metal layers; the first data line connecting portion comprises a bending portion disposed corresponding to the line change hole in a corresponding one of the pixel areas; and the bending portion is bent in a direction away from the corresponding line change hole.

16. The display device of claim 15, wherein a shape of the bending portion comprises one of a rectangle, a triangle, and an arc.

17. The display device of claim 14, wherein an orthographic projection of at least one of the first data lines on the substrate is located in an orthographic projection between two adjacent ones of the first data line connecting portions on the substrate.

18. The display device of claim 14, wherein at least some of the first data line connecting portions are disposed to overlap middle positions of the corresponding multiple of the pixel areas.

19. The display device of claim 11, wherein the display area is disposed around the hole-drilling area, and the hole-drilling area is symmetrical with respect to a symmetry axis extending along the first direction; and the data connecting lines are symmetrically disposed with respect to the symmetry axis.

20. The display device of claim 11, wherein a material of the fan-out lines and the data connecting lines comprises indium tin oxide.

* * * * *